United States Patent [19]
Sugasawa

[11] Patent Number: 5,867,046
[45] Date of Patent: Feb. 2, 1999

[54] MULTI-PHASE CLOCK GENERATOR CIRCUIT

[75] Inventor: Yasuo Sugasawa, Kumamoto, Japan

[73] Assignee: NEC Corporation, Tokyo, Japan

[21] Appl. No.: 916,365

[22] Filed: Aug. 22, 1997

[30] Foreign Application Priority Data

Aug. 23, 1996 [JP] Japan ..................................... 8-222248

[51] Int. Cl.⁶ ................. H03K 3/01; H03K 5/00
[52] U.S. Cl. .......................... 327/258; 327/256; 327/259; 327/293; 327/295; 326/93
[58] Field of Search ..................... 327/256, 258, 327/259, 293, 295; 326/93, 96

[56] References Cited

U.S. PATENT DOCUMENTS

| | | | |
|---|---|---|---|
| 4,283,639 | 8/1981 | Roesler | 307/269 |
| 4,761,568 | 8/1988 | Stronski | 307/269 |
| 4,827,157 | 5/1989 | Machida et al. | 307/262 |
| 5,047,659 | 9/1991 | Ullrich | 307/269 |
| 5,341,031 | 8/1994 | Kinoshita et al. | 307/269 |

FOREIGN PATENT DOCUMENTS

| | | | |
|---|---|---|---|
| 356006525 A | 1/1981 | Japan | 327/258 |
| 363155817 A | 6/1988 | Japan | 327/258 |
| 363253715 A | 10/1988 | Japan | 327/259 |
| 402096422 A | 4/1990 | Japan | 327/259 |

*Primary Examiner*—Timothy P. Callahan
*Assistant Examiner*—An T. Luu
*Attorney, Agent, or Firm*—Young & Thompson

[57] ABSTRACT

A multi-phase clock generator for receiving an external clock signal through a PLL and for generating a plurality of internal clock signals differing in phase from each other. The multi-phase clock generator includes two large gates whose outputs are the two internal clock signals, and two latch circuits for controlling the logic gate outputs. The output from the PLL is fed forward to the logic gates so that the rise of one internal clock signal is separated from a prior fall of the other internal clock signal by a period related to the frequency of the PLL output.

8 Claims, 5 Drawing Sheets

MULTI-PHASE CLOCK GENERATOR CIRCUIT

BACKGROUND OF THE INVENTION

The present invention relates to a multi-phase clock generator circuit, and more particularly to a clock generator circuit having a phase lock loop for generating a plurality of synchronizing clock signals.

It had been known in the art to which the invention pertains that the phase lock loop is used for generating multi-phase internal clock signals from an external clock signal.

FIG. 1A is a circuit diagram illustrative of a conventional clock generator circuit having a phase lock loop. The clock generator circuit has a phase lock loop circuit 1A which receives an input of clock signals CL and generates an output of clock signals CAA which frequency is four times higher than the clock signals CL. The clock generator circuit also has ½ frequency divider circuit 2A which receives an input of the clock signals CAA and generates an output of clock signals CBA which is lower by two times than the clock signals CAA. The clock generator circuit also has logic circuits for generating two phase internal clock signals C1 and C2. The logic circuit has first and second AND gates 11 and 12 as well as first and second delay circuits 7 and 8 in addition an invertor circuit 13. The first AND circuit 11 has an output side which is connected to a first output terminal on which the first internal clock signal C1 appears. The second AND circuit 12 has an output side which is connected to a second output terminal on which the second internal clock signal C2 appears. The output side of the first AND circuit 11 is also connected to an input side of the second delay circuit 8. The output side of the second AND circuit 12 is also connected to an input side of the first delay circuit 7. The first delay circuit generates from the output side a delayed signal C7. The output side of the first delay circuit 7 is connected to one of the input terminals of the first AND gate 11. The output side of the ½ frequency divider circuit 2A is also connected to another input terminal of the first AND gate 11. The second delay circuit 8 generates from the output side a second delayed signal C8. The output side of the second delay circuit 8 is connected to one of the input terminals of the second AND gate 12. The output side of the ½ frequency divider circuit 2A is also connected to an input side of the invertor 13. The invertor 13 generates from an output side an inverted signal. The output side of the invertor 13 is connected to one of the input terminals of the second AND gate 12. The output side of the second delay circuit 8 is connected to the other input terminal of the second AND gate 12.

FIG. 1B is a circuit diagram illustrative of a first delay circuit provided in a conventional clock generator circuit having a phase lock loop of FIG. 1A. The first delay circuit 7 comprises a resistor R1 connected in series between the input and output sides, and a capacitor C1 connected between a ground line and the output side of the first delay circuit 7.

FIG. 1C is a circuit diagram illustrative of a second delay circuit provided in a conventional clock generator circuit having a phase lock loop of FIG. 1A. The second delay circuit 8 comprises a series connection of two invertor circuits 17 and 18 between the input and output sides as well as a capacitor C2 connected between the ground line and an intermediate point between the two invertor circuits 17 and 18. The invertor circuit 17 is connected to the input side whilst the invertor circuit 18 is connected to the output side.

FIG. 2 is a timing chart illustrative of waveforms of lock signals transmitting in a conventional clock generator circuit of FIG. 1A. The clock signal C1 is inputted into the phase lock loop circuit 1A whereby the external clock signal C1 is fourfold-multiplied to generate the signal CAA which is four times higher in frequency than the clock signal C1. The signal CAA is then inputted into the ½ frequency divider circuit 2A whereby the signal CAA is divided to generate the signal CBA. The first internal clock signal C1 falls in synchronization with the fall-timing of the signal CBA and rises in synchronous with the fall-timing of the first delayed signal C7 which is delayed by a time period TD1A from the fall-timing of the second internal clock C2. The second internal clock signal C2 fall in synchronization with the rise-timing of the signal CBA and rises in synchronization with the fall-timing of the second delayed signal C8 which is delayed by the time period TD1A from the fall-timing of the first internal clock C1. If the multiple phase internal clock signals are used, it is required to avoid any overlap of high level time periods of the multiple phase internal clock signals, for which purposes the first and second delay circuits 7 and 8 are provided to delay the rise-timings of the first and second internal clock signals C1 and C2.

The above conventional clock generator circuit has the following problems related to the first and second delay circuits 7 and 8. Variations in conditions for semiconductor manufacturing processes cause variations in the resistance value of the resistor R1 used in the first delay circuit 7 as well as variation in capacitance of the capacitors C1 and C2 used in the first delay circuit 7. Such variations can also cause variation in trans conductance of transistors used in the investors 17 and 18 of the second delay circuit 8. Furthermore, the resistance value of the resistor R1 and the trans conductance of transistors used in the invertors 17 and 18 are variable depending upon a temperature of the transistors in use. Moreover the trans conductance of transistors used in the invertors 17 and 18 is variable depending upon a power voltage for driving the circuit. A total amount of the variation in those parameters may be considerable. Considering that the total amount of the variation in those parameters has a maximum value, then the delayed time of the delay circuit may be varied by 50% or more. Such large variation in delay time of the delay circuit causes a large variation in duty of the first and second internal clock signals C1 and C2. This makes it difficult to set wide operational conditions of the semiconductor device.

In the above circumstances, it had been required to develop a novel multi-phase clock generator circuit with reduced variation in duty of internal clock signals.

SUMMARY OF THE INVENTION

Accordingly, it is an object of the present invention to provide a novel multi-phase clock generator circuit free from the above problems.

It is a further object of the present invention to provide a novel multi-phase clock generator circuit with reduced variation in duty of internal clock signals.

The above and other objects, features and advantages of the present invention will be apparent from the following descriptions.

The present invention provides a multi-phase clock generator for receiving an external clock signal and generating a plurality of internal clock signals differing in phase from each other. The multi-phase clock generator is provided with a duty controller for controlling duties of the plurality of internal clock signals in synchronization with an output from an oscillator.

It is preferable that the controller is capable for set fixed duties of the plurality of internal clock signals.

It is also preferable that the controller is capable of varying the duties for the plurality of internal clock signals.

BRIEF DESCRIPTIONS OF THE DRAWINGS

Preferred embodiments according to the present invention will be described in detail with reference to the accompanying drawings.

EMBODIMENTS
FIRST EMBODIMENT

Figure 1A:
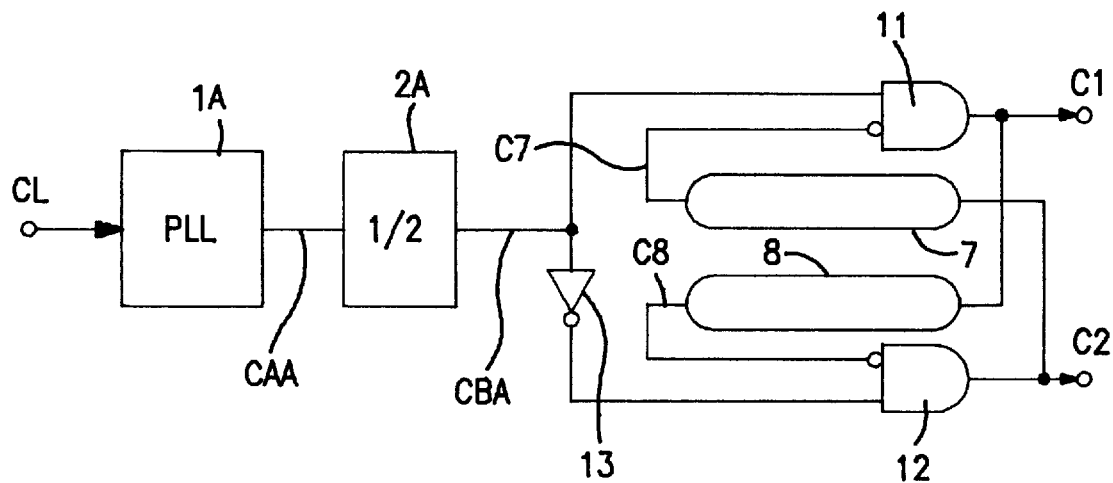
FIG. 1A is a circuit diagram illustrative of a conventional clock generator circuit having a phase lock loop.
Figure 1B:
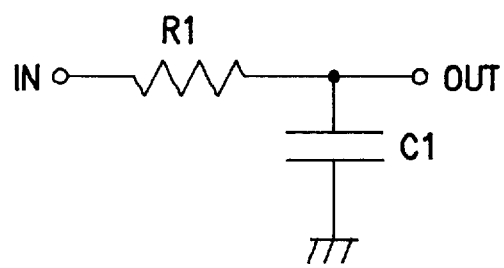
FIG. 1B is a circuit diagram illustrative of a first delay circuit provided in a conventional clock generator circuit having a phase lock loop of FIG. 1A.
Figure 1C:
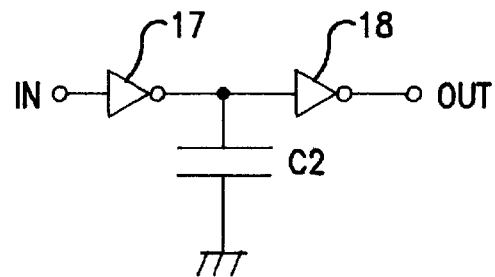
FIG. 1C is a circuit diagram illustrative of a second delay circuit provided in a conventional clock generator circuit having a phase lock loop of FIG. 1A.
Figure 2:
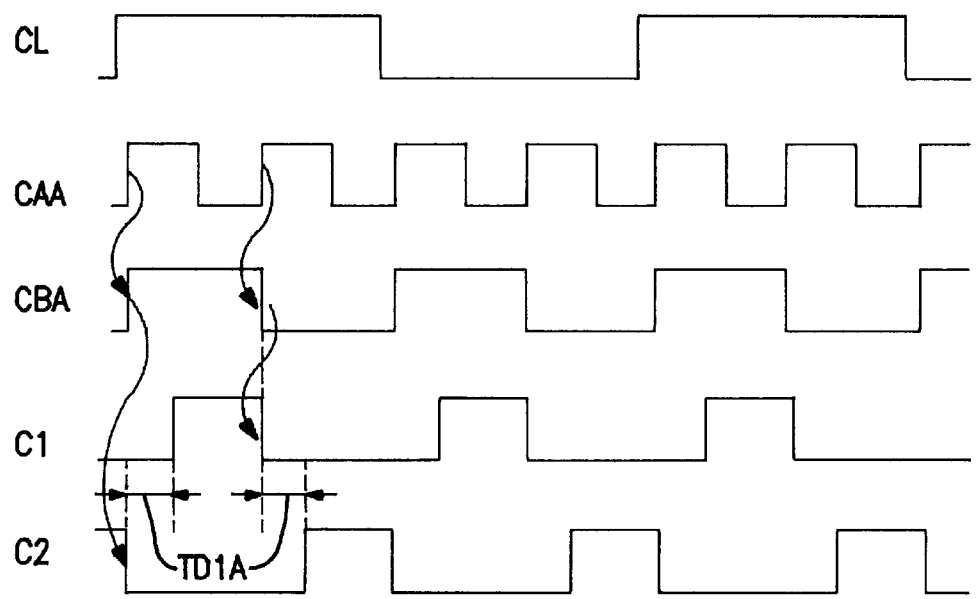
FIG. 2 is a timing chart illustrative of waveforms of lock signals transmitting in a conventional clock generator circuit of FIG. 1A.
Figure 3:
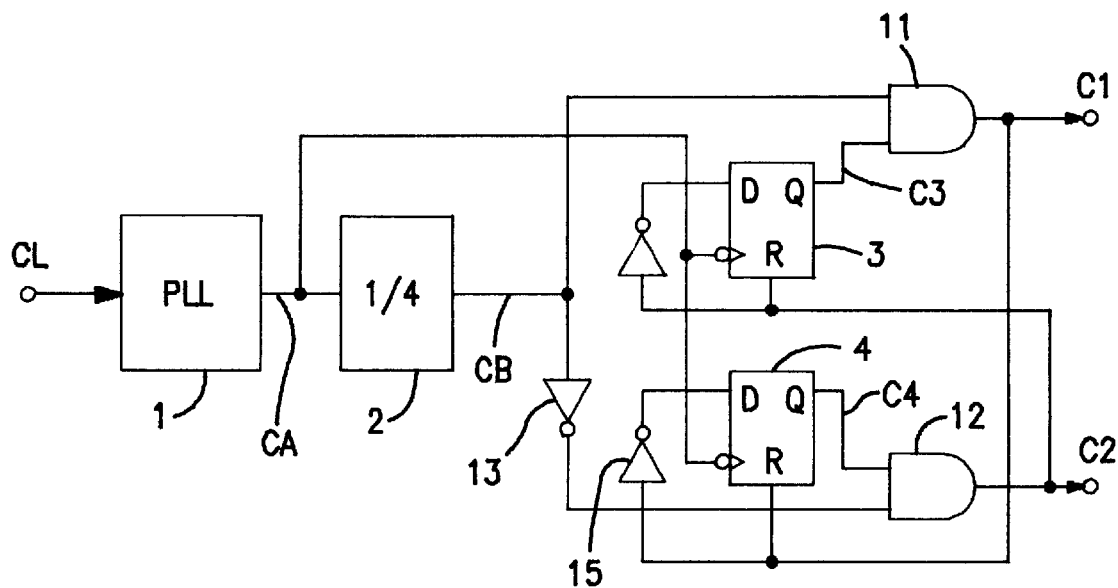
FIG. 3 is a circuit diagram illustrative of a novel clock generator circuit having a phase lock loop in a first embodiment according to the present invention.

A first embodiment according to the present invention will be described in detail with reference to FIGS. 3 and 4. FIG. 3 is a circuit diagram illustrative of a novel clock generator circuit having a phase lock loop in a first embodiment according to the present invention. The clock generator circuit has a phase lock loop circuit 1 which receives an input of clock signals CL and generates an output of clock signals CA which has been eight-fold multiplied so that frequency of the clock signals CA is eight times higher than the clock signals CL. The clock generator circuit also has ¼ frequency divider circuit 2 which receives an input of the clock signals CA and generates an output of clock signals CB which is lower by four times than the clock signals CA. The clock generator circuit also has logic circuits for generating two phase internal clock signals C1 and C2. The logic circuit has first and second AND gates 11 and 12 as well as first and second latch circuits 3 and 4 and first, second and third invertors 13, 14 and 15. The first AND circuit 11 has an output side which is connected to a first output terminal on which the first internal clock signal C1 appears. The second AND circuit 12 has an output side which is connected to a second output terminal on which the second internal clock signal C2 appears. The output side of the first AND circuit 11 is also connected to an input side of the third invertor 15. The output side of the second AND circuit 12 is also connected to an input side of the second invertor 14. An output side of the third invertor 15 is connected to an input side of the second flip-fop circuit 4. The output side of the phase lock loop circuit 1 is connected to the other input side of the second latch circuit 4. The output side of the phase lock loop circuit 1 is also connected to the other input side of the first latch circuit 3. The output side of the second invertor 14 is connected to the input side of the first latch circuit 3. The output side of the first AND gate 11 is also connected to the reset terminal R of the second latch circuit 4. The output side of the second AND gate 12 is also connected to the reset terminal R of the first latch circuit 3. The output side of the first latch circuit 3 is also connected to one the input terminals of the first AND gate 11. The output side of the second latch circuit 4 is also connected to one of input terminals of the second AND gate 12. The output side of the ¼ frequency-divider 2 is also connected to the other input terminal of the first AND gate 11. The output side of the ¼ frequency-divider 2 is also connected through the first invertor 13 to the other input terminal of the second AND gate 12.

Figure 4:
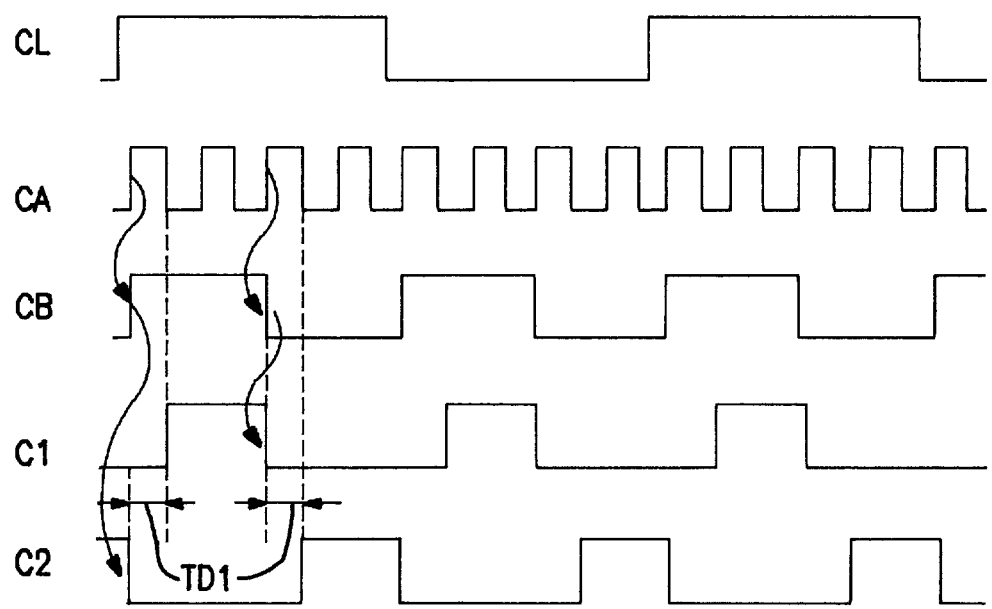
FIG. 4 is a timing chart illustrative of waveforms of lock signals transmitting in a novel clock generator circuit having a phase lock loop in the first embodiment according to the present invention.

FIG. 4 is a timing chart illustrative of waveforms of lock signals transmitting in a novel clock generator circuit having a phase lock loop in the first embodiment according to the present invention. The clock signal CL is inputted into the phase lock loop circuit 1 whereby the external clock signal CL is eight-fold multiplied to generate the signal CA which is eight times higher in frequency than the clock signal CL. The signal CA is then inputted into the ¼ frequency divider circuit 2 whereby the signal CA is divided to generate the signal CB. The first internal clock signal C1 falls in synchronization with the fall-timing of the signal CB and rises in synchronization with a timing which is delayed by TD1 corresponding to a half of one frequency from the rise-timing of the signal CB. The second internal clock signal C2 falls in synchronization with the rise-timing of the signal CB and rises in synchronization with a timing which is delayed by TD1 corresponding to a half of one frequency from the fall-timing of the first internal clock C1. The time-period TD1 corresponds to a high level time-period of the signal CA. Namely, the time-periods of the high level of the first and second internal clock signals C1 and C2 do not overlap and are separated from each other by the time period TD1.

Variations in condition for semiconductor manufacturing processes, and in temperature as well as power voltage may cause variation in voltage level of the output signal CA from the phase lock loop circuit 1, notwithstanding it is possible to suppress the variation in voltage level of the output signal CA within 10%. As a result, it is also possible to suppress the variation in duty of the first and second internal clock signals C1 and C2.

SECOND EMBODIMENT

Figure 5:
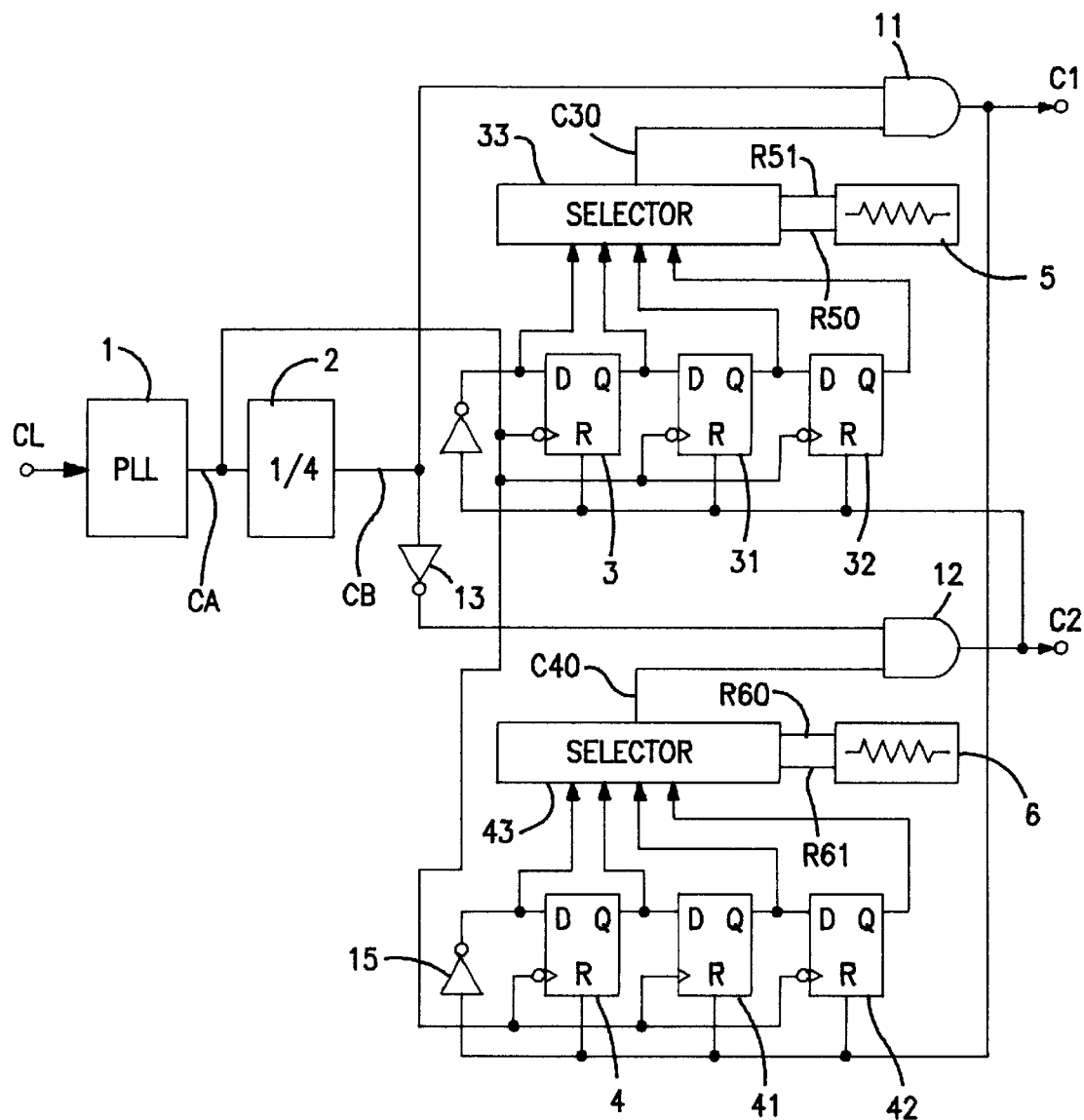
FIG. 5 is a circuit diagram illustrative of a novel clock generator circuit having a phase lock loop in a second embodiment according to the present invention.

A second embodiment according to the present invention will be described in detail with reference to FIGS. 5 and 6. FIG. 5 is a circuit diagram illustrative of a novel clock generator circuit having a phase lock loop in a second embodiment according to the present invention. The clock generator circuit has a phase lock loop circuit 1 which receives an input of clock signals CL and generates an output of clock signals CA which has been eight-fold multiplied so that frequency of the clock signals CA is eight times higher than the clock signals CL. The clock generator circuit also has ¼ frequency divider circuit 2 which receives an input of the clock signals CA and generates an output of clock signals CB which is lower by four times than the clock signals CA. The clock generator circuit also has logic circuits and selectors and resistors for generating two phase internal clock signals C1 and C2. The logic circuit has first and second AND gates 11 and 12 as well as first, second, third, fourth, fifth and sixth latch circuits 3, 4, 31, 41, 32 and 42 and first, second and third invertors 13, 14 and 15. First and second selectors 33 and 43 are further provided. Furthermore, first and second resistors 5 and 6 are provided. The first AND circuit 11 has an output side which is connected to a first output terminal on which the first internal clock signal C1 appears. The second AND circuit 12 has an output side which is connected to a second output terminal on which the second internal clock signal C2 appears. The output side of the first AND circuit 11 is also connected to an input side of the third invertor 15. The output side of the second AND circuit 12 is also connected to an input side of the second invertor 14. An output side of the third invertor 15 is connected to an input side of the second flip-fop circuit 4. An output side of the third invertor 15 is also connected to an input side of the second selector 43. The output side of the phase lock loop circuit 1 is connected to the other input side of the second latch circuit 4. The output side of the phase lock loop circuit 1 is also connected to the other input side of the first latch circuit 3. The output side of the phase lock loop circuit 1 is further connected to the other input side of each of the fourth and sixth latch circuits 41 and 42. The output side of the phase lock loop circuit 1 is also connected to the other input side of each of the third and fifth latch circuits 31 and 32. The output side of the second invertor 14 is connected to the input side of the first latch circuit 3. The output side of the second invertor 14 is also connected to the first selector 33. The output side of the first AND gate 11 is also connected to the reset terminal R of each of the second, fourth and sixth latch circuits 4, 41 and 42. The output side of the second AND gate 12 is also connected to the reset terminal R of each of the first, third and fifth latch circuits 3, 31 and 32. The output side of the first latch circuit 3 is also connected to one of the input terminals of the third latch circuit 31 and also connected to an input side of the first selector 33. The output side of the third latch circuit 31 is also connected to one of input terminals of the fifth latch circuit 32 and also connected to the input side of the first selector 33. The output side of the fifth latch circuit 32 is connected to the input side of the first selector 33. The output side of the second latch circuit 4 is also connected to one of the input terminals of the fourth latch circuit 41 and also connected to an input side of the second selector 43. The output side of the fourth latch circuit 41 is also connected to one of the input terminals of the sixth latch circuit 42 and also connected to the input side of the second selector 43. The output side of the sixth latch circuit 42 is connected to the input side of the second selector 43. The output side of the ¼ frequency-divider 2 is connected to the input terminal of the first AND gate 11. The output side of the ¼ frequency-divider 2 is also connected through the first invertor 13 to the input terminal of the second AND gate 12. The output of the first selector 33 is connected to the other input terminal of the first AND gate 11. The output of the second selector 43 is connected to the other input terminal of the second AND gate 12. The first resistor 5 is connected through two signal lines R50 and R51 to the first selector 33. The second resistor 6 is connected through two signal lines R60 and R61 to the second selector 43. The first and second resistors 5 and 6 set duties of the first and second internal clock signals C1 and C2 respectively.

Figure 6:
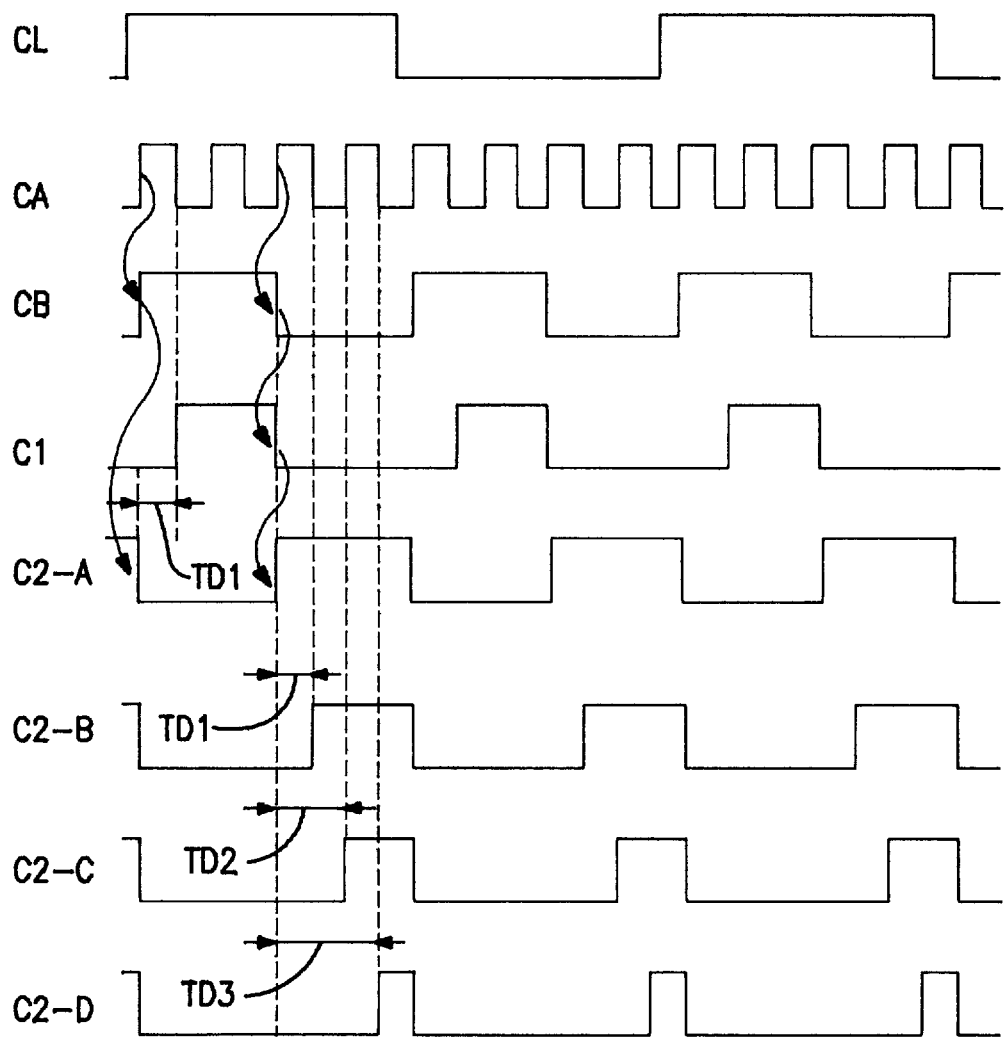
FIG. 6 is a timing chart illustrative of waveforms of lock signals transmitting in a novel clock generator circuit having a phase lock loop in the second embodiment according to the present invention.

FIG. 6 is a timing chart illustrative of waveforms of lock signals transmitting in a novel clock generator circuit having a phase lock loop in the second embodiment according to the present invention. The following descriptions will be made, considering that the set signals R50 and R51 are fixed and the first selector selects the output from the first latch circuit 3. The internal clock signal C1 has the same waveform as in the first embodiment. If the setting of the second resistor 6 is changed, then the internal clock signal C2 is also changed as follows. The internal clock signal waveform C2-A appears if the second selector 43 selects the inverted signal of the first internal clock signal C1 from the third invertor 15. The internal clock signal waveform C2-B appears if the second selector 43 selects the output signal of the second latch circuit 4. The internal clock signal waveform C2-C appears if the second selector 43 selects the output signal of the fourth latch circuit 41. The internal clock signal waveform C2-D appears if the second selector 43 selects the output signal of the sixth latch circuit 42.

The second internal clock signal C2 falls in synchronization with the rise-timing of the signal CB and rises in synchronization with rise or fall-timings of the signals CA. Namely, the time-periods of the high level of the first and second internal clock signals C1 and C2 do not overlap and are separated from each other by the time period TD1.

Variations in condition for semiconductor manufacturing processes, and in temperature as well as power voltage may cause variation in voltage level of the output signal CA from the phase lock loop circuit 1, notwithstanding it is possible to suppress the variation in voltage level of the output signal CA. As a result, it is also possible to suppress the variation in duty of the first and second internal clock signals C1 and C2.

Further, it is possible to control the rise-timing of the internal clock signals C1 and C2 by setting the resistors whereby the duty of the internal clock signals is changeable by changing the re-setting of the resistors.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A clock generator for providing two internal clock signals whose high periods do not overlap, comprising:

an oscillator for receiving an input clock signal and providing an output at a first frequency;

a frequency divider for decreasing the first frequency to a second frequency;

two AND gates, each for providing one of the two internal clock signals as an output, a first of said AND gates having a first input connected to an output from said frequency divider, a second of said AND gates having a first input connected to an inverted output from said frequency divider;

two latch circuits, a first of said latch circuits having an output connected to a second input of said first AND gate, a second of said latch circuits having an output connected to a second input of said second AND gate;

said output from said second AND gate being connected to a reset of said first latch circuit and to a first input of said first latch circuit through a first inverter, an output from said oscillator being connected to a second input of said first latch circuit; and said output from said first AND gate being connected to a reset of said second latch circuit and to a first input of said second latch circuit through a second inverter, an output from said oscillator being connected to a second input of said second latch circuit.

2. The clock generator of claim 1, further comprising a plurality of said first latch circuit and a plurality of said second latch circuit, said plurality of first latch circuits having their outputs connected to said second input of said first AND gate through a first selector for selectively connecting the output of one of said plural first latch circuits to said second input of said first AND gate, and said plurality of second latch circuits having their outputs connected to said second input of said second AND gate through a second selector for selectively connecting the output of one of said plural second latch circuits to said second input of said second AND gate.

3. The clock generator of claim 1, wherein said oscillator is a phase lock loop.

4. The clock generator of claim 1, wherein said oscillator is for increasing a frequency of the input clock signal by a factor of eight and said frequency divider is a one-quarter frequency divider.

5. A clock generator for providing two internal clock signals whose high periods do not overlap, comprising:
   an oscillator for receiving an input clock signal and providing an output at a first frequency;
   a frequency divider for decreasing the first frequency to a second frequency;
   two logic gates, each for providing one of the two internal clock signals as an output, a first of said logic gates having a first input connected to an output from said frequency divider, a second of said logic gates having a first input connected to an inverted output from said frequency divider; and
   two latch circuits connected to said two logic gates for controlling the outputs therefrom, an output from said oscillator being connected to an input of one of said latch circuits and to an input of the other of said latch circuits so that a rise of a first said internal clock signal is separated from a prior fall of a second said internal clock signal by at least one half of one period of the first frequency.

6. The clock generator of claim 5, wherein a first of said latch circuits has an output connected to a second input of said first logic gate, a second of said latch circuits has an output connected to a second input of said second logic gate, said output from said second logic gate is connected to a reset of said first latch circuit and to a first input of said first latch circuit through a first inverter, said output from said oscillator is connected to a second input of said first latch circuit, said output from said first logic gate is connected to a reset of said second latch circuit and to a first input of said second latch circuit through a second inverter, and said output from said oscillator is connected to a second input of said second latch circuit.

7. The clock generator of claim 5, wherein said two logic gates are AND gates.

8. The clock generator of claim 5, wherein said output from said oscillator is connected directly to said inputs of said two latch circuits.

* * * * *